United States Patent [19]

Davies

[11] Patent Number: 4,871,686
[45] Date of Patent: Oct. 3, 1989

[54] INTEGRATED SCHOTTKY DIODE AND TRANSISTOR

[75] Inventor: Robert B. Davies, Tempe, Ariz.

[73] Assignee: Motorola, Inc., Schaumburg, Ill.

[21] Appl. No.: 173,795

[22] Filed: Mar. 28, 1988

[51] Int. Cl.$^4$ ............................................ H01L 29/56
[52] U.S. Cl. ...................................... 437/39; 357/15; 437/175; 437/178; 437/187
[58] Field of Search ................... 437/39, 778, 201, 31, 437/175; 357/15

[56] References Cited

U.S. PATENT DOCUMENTS

| | | | |
|---|---|---|---|
| 3,590,471 | 7/1971 | Lepselter | 437/39 |
| 3,938,243 | 2/1976 | Rosvold | 357/15 |
| 3,943,554 | 3/1976 | Russel | 357/15 |
| 4,127,860 | 12/1978 | Beelitz | 357/15 |
| 4,156,246 | 5/1979 | Pedersen | 357/15 |
| 4,253,105 | 2/1981 | Olmstead | 357/15 |
| 4,380,021 | 4/1983 | Whatsuyama | 357/15 |
| 4,443,808 | 4/1984 | Kihara | 357/15 |
| 4,586,071 | 4/1986 | Tiwari | 357/15 |

FOREIGN PATENT DOCUMENTS 48209 9/1982 Japan ........................................ 437/39

Primary Examiner—Brian E. Hearn
Assistant Examiner—Anthony Gutierrez
Attorney, Agent, or Firm—Joe E. Barbee

[57] ABSTRACT

An improved means and method is described for forming a Schottky diode integrated with transistors and other devices which is particularly useful where both control circuits and a large power device are on the same chip.

Nested N—, P—, N— and P+ regions are formed on an N+ semiconductor substrate. A portion of the overlying dielectric is removed adjacent one of the P+ regions over the N— region and a Schottky contact formed to the N— region and an ohmic contact to the adjacent P+ region. N+ and P+ regions are desirably provided where the junctions between the N—/P— regions and the P—/N— regions intersect the surface to provide contact to the N— and P— regions respectively.

A P region extends through the upper N— region and has U-shaped arms which partially overlie an annular shaped P+ region and is located between the active region of the PNP transistor and the collector contact to serve as a Kelvin probe. The arrangement is particularly valuable where a vertical PNP device without a buried collector region is required.

16 Claims, 3 Drawing Sheets

INTEGRATED SCHOTTKY DIODE AND TRANSISTOR

FIELD OF THE INVENTION

This invention relates to means and methods for forming improved transistors and Schottky diodes and more particularly, to means and methods for forming integrated Schottky diodes and transistors.

BACKGROUND ART

It is known in the art to provide integrated semiconductor elements in which relatively tiny but complex logic and/or control devices and circuits are integrated on the same semiconductor chip with very much larger power devices previously only available in separate discrete form. As used herein, the words "smart-power" are intended to refer to such integrated, single chip, combined logic/control plus power device functions.

Integration of logic/control and power device functions on the same chip places more stringent and different demands upon the structure and the fabrication process than where those elements are provided in separate chips. For example, the location of and means for forming the various P and/or N regions in the chip must take into account the frequently conflicting requirements of the logic/control circuits and the power devices.

In many smart-power devices it is desired to be able to provide a charge pump, that is, a means for providing internally a voltage which is above the supply voltage or not readily derived from the supply voltage by the usual voltage dividers. In the prior art this has been accomplished by using a transistor connected as a diode in a voltage doubler circuit. However, this approach suffers from a number of limitations well known in the art. It has been found that improved devices may be prepared by using an integrated Schottky diode for this function.

At the same time, a Schottky diode may also be used in smart-power devices as a clamp diode or charge pump rectifier or as an improved Kelvin voltage sense contact to the collector region of a bipolar transistor to provide improved clamping of the emitter-base voltage.

Accordingly it is an object of the present invention to provide a means and method for an improved integrated Schottky diode which is particularly convenient for use in smart-power devices.

It is a further object of the present invention to provide a means and method for an improved integrated Schottky diode which is suitable for use as a charge pump diode.

It is an additional object of the present invention to provide a means and method for an improved integrated Schottky diode which is suitable for use as a Kelvin contact to the collector of an integrated bipolar transistor.

It is an further object of the present invention to provide the foregoing using a structure and process which is compatible with the other structure and process requirements for forming smart-power type devices.

SUMMARY OF THE INVENTION

These and other advantages and objectives are achieved by a semiconductor device having an integrated Schottky diode comprising: a semiconductor substrate having a major surface and containing a first region of a first type extending to the surface and having a first depth into the substrate; a second region of a second type opposite the first type, located within the first region, extending to the surface and having a second depth into the substrate; a third region of the first type, located within the second region, extending to the surface and having a third depth into the substrate; optionally, a fourth region of the second type located within the third region, extending to the surface and having, a fourth depth into the substrate; a fifth region of the second type located within the third region, extending to the surface, at least partially overlapping the fourth region and having a fifth depth into the substrate less than the third depth; a first portion of the surface including a first part of the third region at the surface and a first part of the fourth region at the surface; and a conductor on the first portion of the surface wherein the conductor forms an ohmic contact to the first part of the fourth and/or fifth regions and a Schottky contact to the first part of the third region.

In a further embodiment wherein the Schottky diode incorporates a Kelvin probe contact to the collector region of a bipolar transistor, it is desirable that the fourth region be deeper than the third region and, when viewed looking toward the surface, have U-shaped arms substantially enclosing the fifth region on three sides leaving a fourth side of the fifth region not enclosed by the fourth region.

The fifth region desirably has an annular shape with the Schottky contact to the third region located in the center thereof. It is further desirable that the device comprise a sixth region of the second type located within the third region, separated from the fourth side of the fifth region by another part of the third region, extending to the surface and having a depth into the substrate less than the third depth. Optional seventh and eighth doped regions are desirably located at the surface, respectively, at an intersection of the second and third regions and at an intersection of the second and first regions, wherein the seventh region is of the first type and has a depth into the substrate less than the third region and the eighth region is of the second type and has a depth less than the second region.

An integrated Schottky diode structure is conveniently formed by the steps of: providing a semiconductor substrate having a first region of a first type extending to a principal surface; providing a second doped region of a second type opposite the first type which forms a first junction with the first region extending to the surface; providing a third doped region of the first type in the second region which forms a second junction with the second region extending to the surface; then in either order, (a) providing a fourth doped region of the second type located at the intersection of the first junction and the surface and a fifth doped region of the second type laterally within the third region at the surface, and (b) providing a sixth doped region of the first type located at the intersection of the second junction and the surface; exposing first, second and third portions of the surface respectively, on the fourth, fifth, and sixth doped regions and a fourth portion of the surface laterally within the third region desirably adjacent to the second portion of the surface; and providing a Schottky contact to the fourth portion of the surface which extends onto the second portion of the surface and providing ohmic contacts to the first and third portions of the surface, desirably simultaneously. The fourth and sixth doped regions are optimal.

Further contact is desirably provided by covering the conductor used for the Schottky contact with a diffusion barrier conductor and then covering the diffusion barrier conductor with a further conductor.

It is desirable that the impurity concentration at the surface of the second portion exceeds $10^{19}$ atoms/cm$^3$, preferably exceeding about $10^{20}$ atoms/cm$^3$, and that the impurity concentration at the surface of the fourth portion is less than $10^{18}$ atoms/cm$^3$, preferably less than about $10^{17}$ atoms/cm$^3$.

Where a simple Schottky contact diode is desired as for example for the charge pump function, it is desirable that the Schottky contact be substantially laterally surrounded by a doped region of the second type located in the third region and having a depth less than the third region.

Where the Kelvin probe function is needed it is desirable that the fifth region be U shaped when viewed perpendicular to the substrate surface and extend through the third region and surround on three sides a further region of the same type located in and not extending through the third region, and that there be provided a still further region of the same type in and shallower than the third region and laterally spaced from the further region.

DETAILED DESCRIPTION OF THE DRAWINGS

While the above listed figures and the description given herein illustrate particular combinations of P and N regions, those of skill in the art will understand that this is merely for ease of explanation and that equivalent devices of opposite type are constructed by interchanging N and P, that other combinations of N and P regions may be utilized based on the teachings herein and that the described invention is not intended to be limited to merely the particular combinations of N and P regions shown. Further, while silicon is described as an exemplary semiconductor substrate material, those of skill in the art will understand that the invention also applies to other semiconductors and is not limited merely to silicon.

FIGS. 1A–1F show simplified cross-sections of a portion of a semiconductor chip of, for example silicon, containing a smart-power device with an integrated Schottky, during different stages of fabrication. Those of skill in the art will understand that the semiconductor chips are first prepared in the form of wafers containing many identical chips which are then cut apart to yield the final smart-power device. Many individual devices may be provided on a single smart-power chip.

Figure 1A:
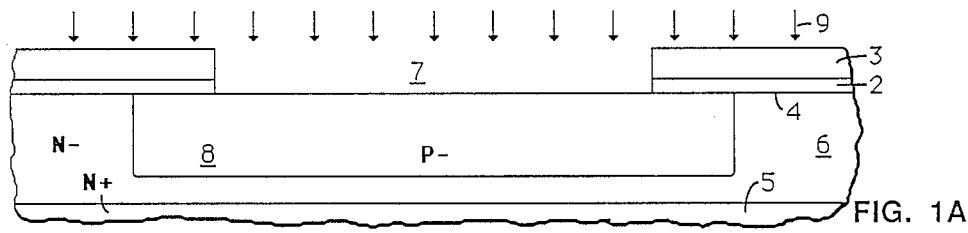
FIGS. 1A–1F are simplified partial cross-sections of a semiconductor chip embodying an integrated Schottky diode of the present invention, according to a first embodiment and at different stages of fabrication.

Referring now to FIG. 1A, dielectric mask layer 2 (e.g., silicon oxide or silicon nitride or silicon oxynitride or the like) and photoresist mask layer 3 are provided on surface 4 of substrate 5. Substrate 5 of, for example N+ silicon, has therein doped region 6 (e.g., N−), which is conveniently formed, for example, by epitaxial growth although other methods for forming region 6 may also be used. Substrate 5 is heavily doped and region 6 is typically lightly doped, for example to about $3\times10^{15}$ cm$^3$, but other doping levels in the range $10^{14}$ to $5\times10^{16}$ /cm$^3$ may also be used. Those of skill in the art will understand how to vary the doping level of region 6 depending upon the desired final device characteristics.

Opening 7 is provided extending through layers 2, 3 to surface 4 using means well known in the art. Lightly doped (e.g., P−) region 8 of opposite type to region 6 is formed typically by ion implantation of impurity 9 through mask opening 7 followed by annealing and activation.

Preferred implant conditions are about 90 keV and $5\times10^{12}$ ions/cm$^2$ (boron) followed by a thermal anneal at about 1200° C. for times up to about 15 hours, followed by a second implant at about the same energy (but through a thicker surface oxide) and a higher dose, e.g., about $1.3\times10^{13}$ ions/cm$^2$, to locate the peak of the second implant at a shallower depth than the first implant and with a higher concentration. The second implant is conveniently annealed during subsequent thermal process steps and while a separate annealing step may be used it is not necessary. The use of a double implant allows the dopant profile to be more closely adjusted and is a desirable feature of the present process. The resulting boron surface concentration of region 8 after annealing is determined primarily by the second implant and is about $2\times10^{16}$ /cm$^3$, but surface concentrations in the range $5\times10^{15}$ to $5\times10^{16}$ /cm$^3$ are also useful. The first implant and long anneal produces a dopant tail extending deeply into the substrate.

While ion implantation is preferred for forming region 8, other methods may also be used. It is desirable that region 8 be shallower than region 6 so as to not extend into substrate 5. This provides higher breakdown and lower leakage between region 8 and substrate 5. Dielectric is conveniently reformed in window 7 during or after drive-in of dopant 9 so as to provide dielectric 10 covering surface 4 for the next masking step.

Figure 1B:
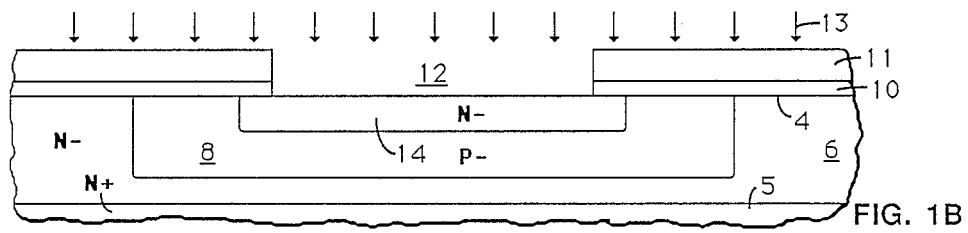

Referring now to FIG. 1B, substrate 5 containing doped regions 6 and 8 has dielectric layer 10 and photomask layer 11 on surface 4. Layers 10 and 11 are etched using means well known in the art to provide opening 12 extending to surface 4. Impurity 13 is provided, again conveniently by ion implantation, to form lightly doped region 14 (e.g., N−) of opposite type than region 8, located within region 8 and extending to surface 4. Typical conditions are a dose of about $1\times10^{13}$ ions/cm$^2$ (phosphorous) at about 120 keV although other energies and doses may be used. Annealing is typically performed at about 1150° C. for about two hours. Surface phosphorous concentrations in region 14 are typically about $6 \times 10^{16}$ /cm$^3$ after annealing. It is important that the surface impurity concentration of region 14 be equal to or higher than that of region 8 so that the semiconductor surface has the conductivity type associated with the dopant of region 14. Region 14 is not as deep as region 8 so that an undisturbed portion of region 8 remains between region 14 and region 6. The junction between regions 8 and 14 is desirably located in the dopant tail region determined primarily by the first (lower dose, long anneal time) boron implant.

Figure 1C:
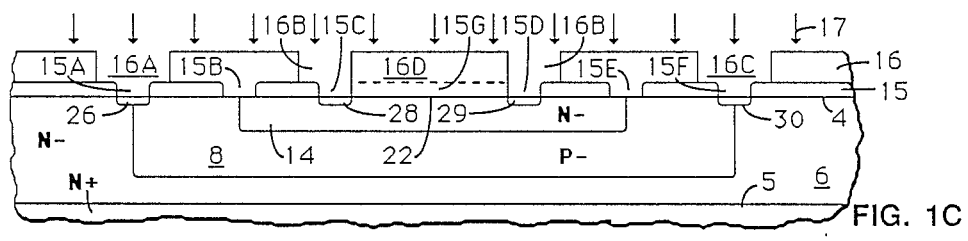

Dielectric is conveniently re-formed in opening 12 using means well known in the art so as to provide dielectric 15 for the next masking step (see FIG. 1C). Dielectric 15, which may consist for example of silicon oxide, nitride or combinations thereof, is etched using means well known in the art (not shown) to provide openings 15A–F therein extending to surface 4. Openings 15A–F act as master-mask openings for the remainder of the fabrication steps and, since they are formed at the same time, are self-aligned. Master-masking techniques are described for example in U.S. Pat. Nos. 4,199,380 and Re. 30,282 which are incorporated herein by reference. Portion 15G (shown dashed in FIG. 1C) of layer 15 may be left in place above portion 22 of surface 4 or removed as a part of the formation of master mask 15. It is more convenient to remove portion 15G since, as will be subsequently explained, this avoids a later masking step.

Referring now to FIG. 1C, block-out mask 16 of, for example photoresist, is applied over master-mask 15. Openings 16A–C of mask 16 are oversized so as to avoid critical alignment requirements. Openings 16A–C select openings 15A, 15C, 15D and 15F of master-mask 15 so that impurities 17 may be implanted or otherwise introduced into substrate 10 in locations 26, 28, 29, and 30. Where portion 15G has been omitted, then portion 16D of mask 16 is included to cover portion 22 of surface 4 between doped regions 28, 29. Where portion 15G has been included then portion 16D may be omitted since portion 15G covers portion 22 between 28, 29.

Boron is a suitable dopant where these regions are desired to be P-type and a heavy dose (e.g., about 10$^{15}$ /cm$^2$ at about 40–50 keV) is desirable so as to make these regions heavily doped, e.g., P+. Activation and annealing may be performed anytime after implantation of impurity 17, e.g., before or after the step shown in FIG. 1D.

Figure 1D:
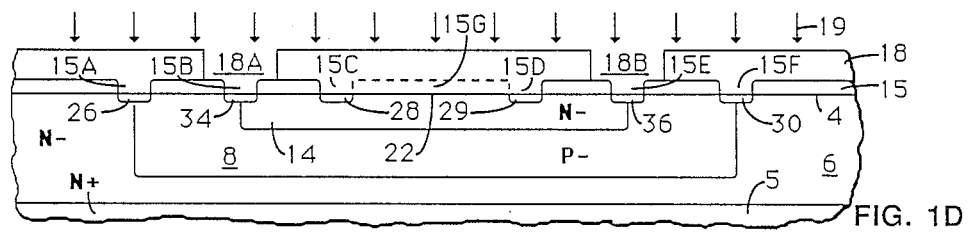

As shown in FIG. 1D, block-out mask 18 having oversized openings 18A–B is applied over master-mask 15 so as to select openings 15B and 15E through which impurities 19 (e.g., phosphorous) are introduced to form heavily doped (e.g., N+) regions 34, 36, respectively. Critical alignment is not required. Doped regions 26–36 are conveniently annealed and activated together, providing the result shown in FIG. 1E. While ion implantation is preferred for forming doped regions 26–36, it is not essential and any means for introducing a comparatively high concentration (e.g., N+ or P+) impurity into these regions may be used. Such means are well known in the art. Further, the steps illustrated in FIGS. 1C and 1D may be interchanged in order.

Figure 1E:
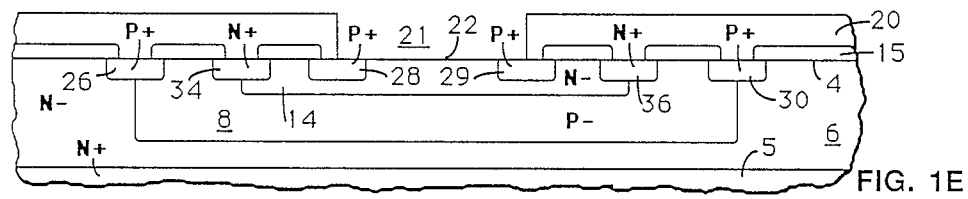

The step shown in FIG. 1E is only needed where portion 15G of mask 15 has been left in place. Mask 20 having opening 21 is provided to select portion 22 of surface 4 of substrate 10 lying between regions 28, 29. Opening 21 is oversized to avoid critical alignment. Opening 21 must overlap at least one and preferably both of openings 15C and 15D of master mask 15 so that when portion 15G of mask 15 overlying surface portion 22 is removed, part of one or both of 28 and 29 are also exposed. Mask 20 is then removed.

Where portion 15G is not provided then the step of FIG. 1E is not needed. This is preferable since it avoids a masking step, but either procedure produces satisfactory results.

It is preferable that openings 15C–D, when viewed looking at the plane of surface 4, join so as to form a closed, annular shaped opening surrounding portion 22 of surface 4. If the Schottky contact is not surrounded at the surface by a contiguous PN junction then leakage is increased. Openings 15B, 15E and 15A, 15F may likewise join to form closed annular shapes in the plane of the substrate surface. This is desirable but not essential.

Figure 1F:
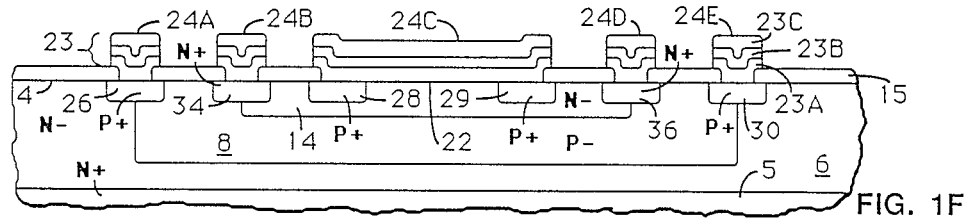

Conductor 23 applied to the structure so as to make contact with the portions of surface 4 exposed in openings 15A–15F and with portion 22 (see FIG. 1F). The material of conductor 23 must be chosen so as to make a Schottky contact to surface portion 22 of semiconductor substrate 5 and ohmic contact to regions 28, 29. It is also desirable that the contacts between conductor 23 and the portions of surface 4 exposed in openings 15A, 15B, 15E and 15F also be ohmic.

Conductor 23 is desirably formed from two or more layers, e.g., layers 23A–C. Layer 23A must have the above described contacting properties, i.e., form a Schottky barrier on surface portion 22 of region 14 and ohmic contact to highly doped regions 26–36. Layer 23B is provided to prevent solid-solid interdiffusion of layer 23A and to provide more conductive and more easily bonded overlayer 23C.

Semiconductor-metal combinations suitable for forming Schottky contacts are well known in the art. For example, where a Schottky contact is desired to N— silicon, platinum or platinum silicide is suitable for layer 23A, Ti-W is suitable for layer 23B, and AlSi or AlCu or AlSiCu is suitable for layer 23C. Other metals and intermetallics well known in the art may also be used for the Schottky contact. Layer 23B conveniently acts as a barrier material to prevent interaction of layers 23A and 23C. However, other conductive material combinations can also be used. Those of skill in the art will understand how to choose appropriate material combinations based on the description given herein and deposit them on substrate 10. Such materials and methods are known in the art.

Contacts 24A, 24E are desirably part of the same annular ohmic contact to P+ regions 26, 30 which provide contact to P— region 8. Contacts 24B, 24D are desirably part of the same annular ohmic contact to N+ regions 34, 36 which provide contact to N— region 14. P+ regions 28, 29 act as a guard ring for Schottky contact 24C to surface portion 22 of region 14. As those of skill in the art will understand based on the description given herein, contacts 24A, 24E; 24B, 24D; and 24C may extend to other devices (not shown) so as to interconnect the Schottky diode formed between contacts 24C and contacts 24B, 24D as is required by the circuit function (e.g., see FIG. 5).

FIGS. 2A–2F are similar to FIGS. 1A–1F, but illustrate a further embodiment of the invention. The same numbers are used to identify device regions formed in substantially the same locations and by the same procedures and having substantially similar functions. FIGS.

Figure 3:
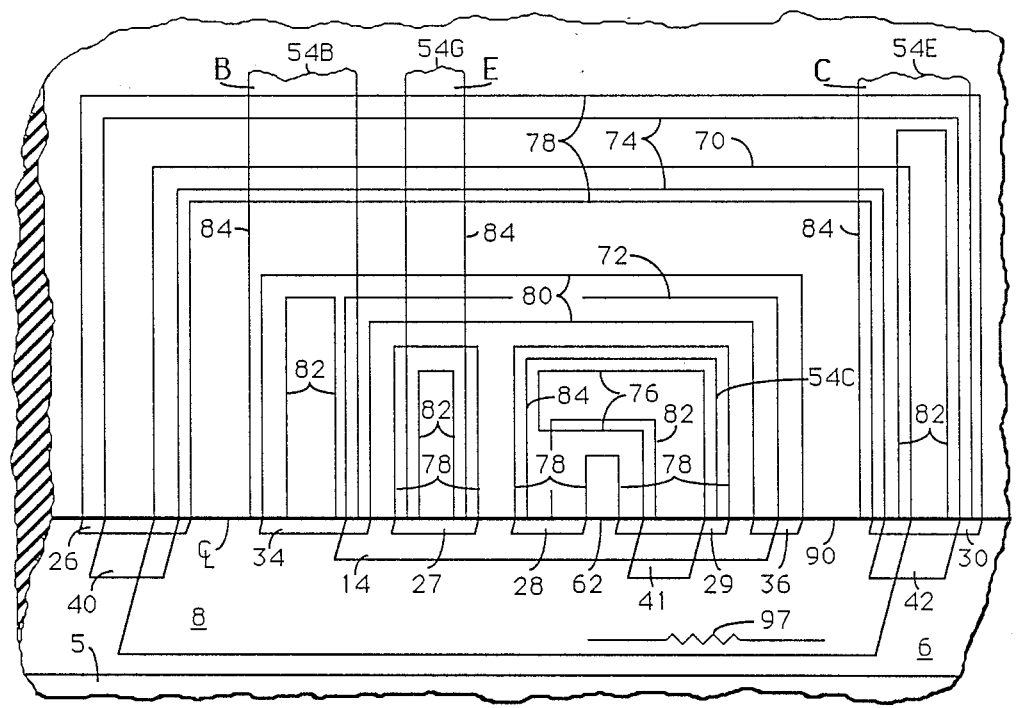
FIG. 3 is a simplified top and partial cut-away view showing the superposition of the masks used to fabricate the device shown in cross-section in FIGS. 2A–2F.

2A-2F show cross-sections along the center-line of FIG. 3 during different stages of fabrication.

Figure 2A:
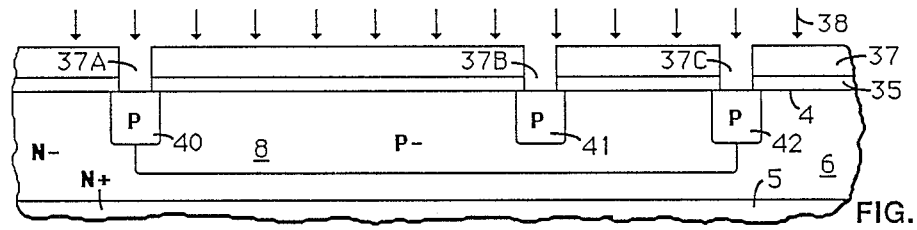
FIGS. 2A–2F are simplified partial cross-sections of a semiconductor chip embodying an integrated Schottky diode of the present invention, similar to those of FIGS. 1A–1F and at different stages of fabrication, and according to a further embodiment of the present invention.
Figure 2B:
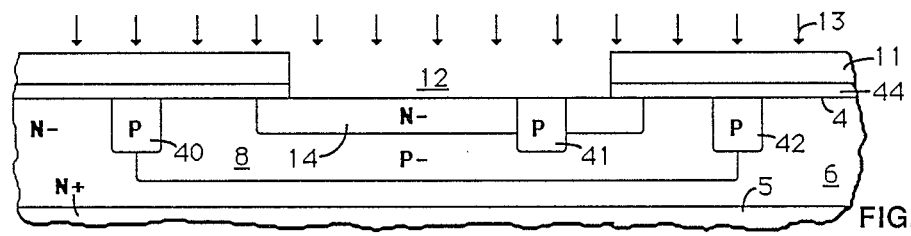

Referring now to FIG. 2A, N+ substrate 5 having N− region 6 and P− region 8 is provided as has already been described in connection with FIGS. 1A-F. Surface 4 of substrate 5 is covered by dielectric 35 and mask 37 in which openings 35A-C have been opened to surface 4 to allow, respectively, formation of moderately doped (e.g., P), regions 40, 41, 42 of the same type as region 8 by implantation and diffusion of impurity 38. Boron is suitable for impurity 38 but other impurities may also be used. Regions 40-42 may be formed by doping means other than ion implantation.

As will be subsequently explained, the depth of region 41 in relation to the depth of region 14 is important. The depths of regions 40 and 42 are not critical and they are formed at the same time as region 41 merely for convenience. Regions 40, 42 are preferred but may be omitted. The dielectric removed in openings 37A-C is conveniently replaced to form dielectric 44 for the next masking step illustrated in FIG. 2B. Mask 11 is applied in the same manner as in FIG. 1B and region 14 formed in region 8 in the same way as previously described. The order of the steps illustrated in FIGS. 2A and 2B may be interchanged with respect to forming regions 40-42 and 14.

Figure 2C:
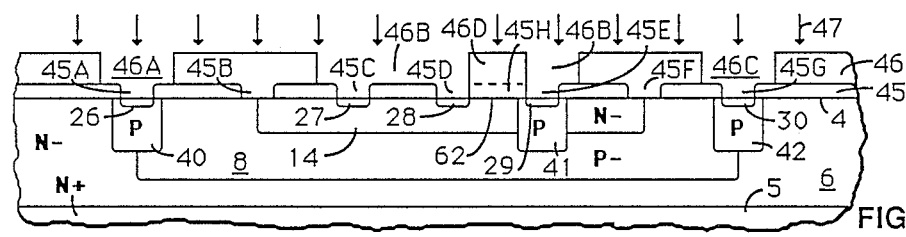

Referring now to FIG. 2c, master mask 45 analogous to master-mask 15 is applied having openings 45A-G extending to surface 4. Portion 45H of mask 45 above surface portion 62 of surface 4 may be provided or omitted in a manner analogous to portions 15G of mask 15 in FIG. 1C. For purposes of illustration portion 45H is shown dashed in FIG. 2c. In the preferred embodiment it is omitted.

Block-out mask 46 having openings 46A-C is applied (FIG. 2c) to select openings 45A, 45C, 45D, 45E, and 45G so that impurities 47 may be implanted to form, respectively, highly doped (e.g., P+) regions 26-30 in surface 4 of substrate 5. At least one P+ region, e.g., region 29 under opening 45E, lies within region 14 and makes contact to previously provided P region 41. Desirably, two other P+ regions 27, 28 also lie within N− region 14 but are spaced apart from P+ region 29. Where mask portion 45H has been omitted, then closed portion 46D is provided to separate regions 28, 29 in a manner analogous to region 16D in FIG. 1C. As is subsequently explained, regions 28, 29 are desirably part of a common annular shaped P+ region with central opening 62.

Figure 2D:
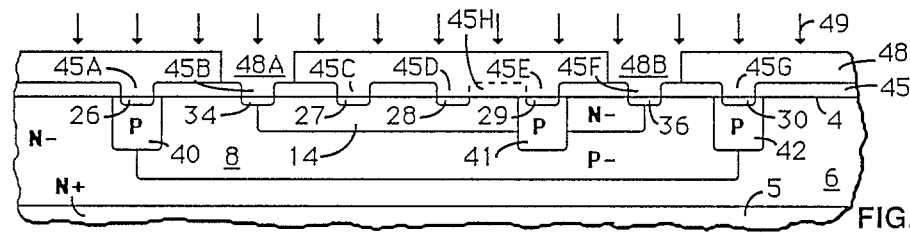

As shown in FIG. 2D, further block-out mask 48 is provided having openings 48A-B which select openings 45B, 45F, respectively, in master-mask 45. Mask 48 is analogous to mask 18 of FIG. 1D. Dopant 49 is provided through openings 48A-B to form highly doped regions 34, 36, (e.g., N+) respectively in surface 4 of substrate 5, in the same manner as has been previously described. The order of the steps illustrated in FIGS. 2c, 2D may be interchanged, just as with the order of the steps in FIGS. 1C, 1D, and the activation/annealing of the implants may be performed individually or simultaneously, as has been previously described. The result is shown in FIG. 2E.

Figure 2E:
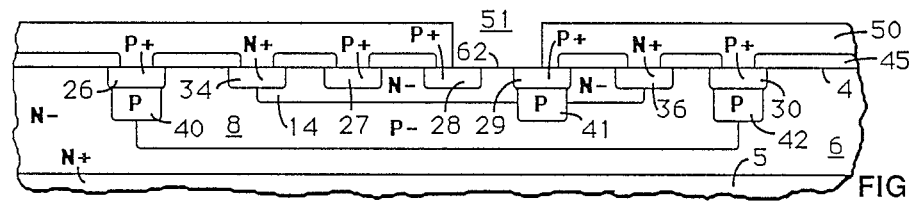

The step of FIG. 2E is only needed where portion 45H of mask 45 has been left in place, as shown by the dashed line in FIGS. 2C-D. It is conveniently removed here using block-out mask 50 so as to expose portion 62 of surface 4 located between regions 28, 29. Opening 51 corresponds to opening 21 of FIG. 1E and exposed surface portion 62 is analogous to portion 22. Mask 50 is then removed.

Following the same procedure as has been described in connection with FIG. 1F, conductive material 23 is applied to form contacts 54A-C and 54E analogous to contacts 24A-C and 24E, respectively. Additional contact 54G is also formed to region 27 in FIG. 2F. A contact analogous to contact 24D may be provided to region 36 but is not necessary and has been omitted from FIG. 2F for simplicity. The materials and methods used to form contacts 54A-C, 54E and 54G are the same as used for forming 24A-D.

FIG. 3 provides a top and partial cut-away view of the structure of FIGS. 2A-2F, that is, looking at the plane of surface 4, with the various masks used to form the device superimposed and looking at the cross-section along centerline 90 with the resulting doped regions outlined. The device of FIG. 3 is desirably symmetrical about centerline 90.

Outline 70 indicates the relative location of mask opening 7 used to form P− tub 8. Outline 72 indicates the relative location of mask opening 12 used to form N-region 14. Outlines 74 indicates the relative location of openings 37A, 37C and outline 76 indicates the relative location of opening 37B.

Outlines 78 indicate the relative locations of openings 45A, 45C, 45D, 45E, and 45G through which P+ regions 26-30 are formed and outlines 80 indicate the relative locations of openings 45B, 45F through which N+ regions 34, 36 are formed. Outlines 82 are pre-ohmic masks for re-opening contact holes through dielectric 45 and outlines 84 indicate the conductive contacts. For simplicity, conductor 54a of FIG. 2F has been omitted from FIG. 3. The location of conductors 54B, 54C, 54E and 54G are indicated on FIG. 3. It will be apparent from FIGS. 2F and 3 that P+ regions 28, 29 are part of a common annular shaped P+ region with central opening 62 wherein the Schottky contact is formed, that region 41 is U-shaped and partially overlaps regions 29, and that region 28 lies between the arms of U-shaped region 41.

Figure 2F:
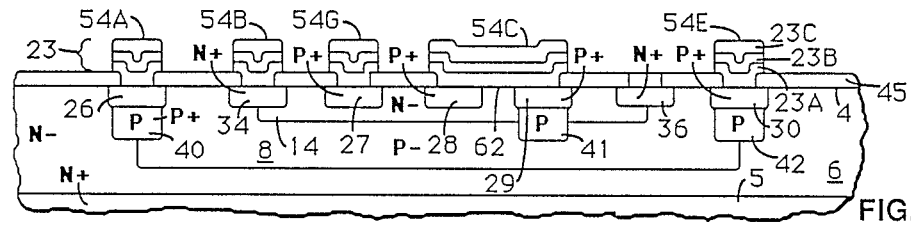

It will also be apparent from FIGS. 2F and 3 that a compact integrated structure results wherein the Schottky diode is located closer to the active region of the device under emitter 27 than is collector contact diffusion 26, 30. This results in the Schottky acting as a Kelvin probe which is not affected by the series drop across internal collector resistance 97, that is the voltage drop due to the lateral current flow within region 8 to collector contact diffusion 26, 30 and collector contact 54E.

Figure 4:
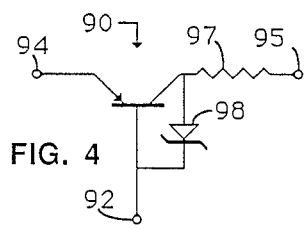
FIG. 4 shows a circuit diagram of a PNP bipolar transistor with an integrated Schottky diode serving as a Kelvin probe across the collector-base.

FIG. 4 shows the equivalent circuit of the arrangement of FIGS. 2F and 3 with series collector resistance 97 indicated. Bipolar transistor 90 has base 92, emitter 94 and collector 96, collector series resistance 97 and Kelvin probe Schottky diode 98 connected between base and collector, but electrically ahead of collector series resistance 97.

Where, as here, the desired transistor does not utilize a low resistance buried collector region, collector resistance is an important consideration. In smart-power devices it is frequently the case, particularly with PNP devices, that it is not practical to include a buried collector region because of conflicting process and structure requirements elsewhere in the device or where a backside collector contact is needed. Hence, the ability to provide a built-in Schottky Kelvin probe that is not affected by series collector resistance is an important advantage under such circumstances. This is a particular feature of the present invention.

Figure 5:
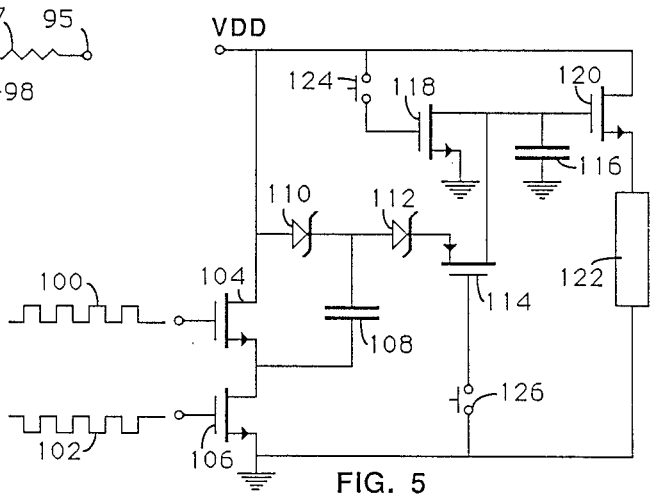
FIG. 5 shows a circuit diagram of a power MOSFET transistor driver with integrated Schottky diodes connected to serve as charge pump diodes for providing a gate voltage higher than the supply voltage to the gate of the power MOSFET.

FIG. 5 illustrates how the Schottky diode of the present invention, as for example in FIG. 1, may be used in a charge pump circuit to provide internal circuit voltages higher than the supply voltage. Out of phase pulse trains 100, 102 are applied to the inputs of transistors 104, 106 which are connected between VDD and ground so that one end of capacitor 108 is alternatively switched between VDD less a threshold voltage, and ground. The other terminal of capacitor 108 connects to the center point of Schottky diodes 110, 112 which extend between VDD and the source of transistor 114. The gate of transistor 114 is connected to ground through switch 126 and the drain is connected to capacitor 116, the drain of transistor 118 and the gate of output transistor 120. Transistor 120 extends between VDD and load 122. Switches 124, 126 are used to stop and start the charge pump action. The action of the circuit is such that after a few cycles of the out of phase signals on transistors 104, 106, the voltage appearing on the gate of output transistor 120 exceeds the supply voltage VDD and is about twice VDD less two Schottky diode voltage drops and a threshold voltage. This substantially reduces the on-resistance of transistor 120 without having to provide a separate external power supply for the gate of transistor 120. This is a great convenience in smart-power circuits.

From the foregoing description and figures it will be apparent that an improved means and method for integrated Schottky diodes and transistors have been provided wherein, among other things, a Schottky diode is available as a charge pump diode or a Kelvin sense probe for a bipolar transistor or for other purposes that will be apparent to those of skill in the art based on the description herein, in a manner not previously taught in the art, and that these advantages have been provided in a manner compatible with other processing requirements for smart-power devices.

Those of skill in the art will appreciate based on the description herein that many variations may be made to the described semiconductor processes and structures without departing from the scope of the present invention. Accordingly it is desired to include all such variations within the claims which follow.

I claim:

1. A process for forming a semiconductor device having an integral Schottky diode, comprising:
    providing a semiconductor substrate of a first type and first impurity concentration and having a principal surface;
    providing a first doped region of a second type opposite the first type and of a second impurity concentration and which forms a first junction with the substrate extending to the surface;
    providing a second doped region of the first type and a third impurity concentration in the first region and which forms a second junction with the first region extending to the surface;
    then in either order, (a) providing a third doped region of the second type and a fourth impurity concentration located at the intersection of the first junction and the surface and a fourth doped region of the second type and a fifth impurity concentration laterally within the second region at the surface, and (b) providing a fifth doped region of the first type and a sixth impurity concentration located at the intersection of the second junction and the surface;
    exposing first, second and third portions of the surface, respectively, on the third, fourth and fifth doped regions and a fourth portion of the surface laterally within the second region adjacent to the second portion of the surface; and
    providing a Schottky contact to the fourth portion of the surface and ohmic contact to the second portion of the surface.

2. The process of claim 1 further comprising covering the Schottky contact with a diffusion barrier conductor and then covering the diffusion barrier conductor with a further conductor.

3. The process of claim 1 wherein the impurity concentration at the surface of the second portion exceeds $10^{19}$ atoms/cm$^3$ and the impurity concentration at the surface of the fourth portion is less than $10^{18}$ atoms/cm$^3$.

4. The process of claim 3 wherein the impurity concentration at the surface of the second portion exceeds about $10^{20}$ atoms/cm$^3$ and the impurity concentration at the surface of the fourth portion is less than about $10^{17}$ atoms/cm$^3$.

5. The process of claim 1 wherein the substrate is silicon and the Schottky contact comprises platinum and silicon.

6. The process of claim 1 wherein the fourth and fifth impurity concentrations are substantially the same.

7. The process of claim 1 wherein the third and fourth regions are formed substantially simultaneously.

8. The process of claim 1 wherein the steps of providing the fourth region and exposing the fourth portion comprise providing the fourth region substantially surrounding the fourth portion.

9. A process for forming a transistor having an integral Schottky diode, comprising:
    providing a semiconductor substrate having a major surface, wherein the substrate has a first region of a first type and impurity concentration extending to the surface;
    providing in the first region a second region of a second type opposite the first type and having a second impurity concentration and forming a first junction extending to the surface;
    then in either order, (i) providing a third region of the first type, having a third impurity concentration, located laterally within the second region and forming a second junction extending to the surface, and (ii) providing a fourth region of the second type, having a fourth impurity concentration, having a first part located laterally within the third region at the surface, wherein the first part of the fourth region extends from the surface through the third region into the second region; and
    forming a Schottky contact to a first portion of the surface of the third region adjacent the first part of the fourth region wherein the contact is shorted to the first part of the fourth region.

10. The process of claim 9 wherein the step of forming the fourth region comprises forming a second part located at the intersection of the first junction and the surface.

11. The process of claim 9 further comprising: providing a fifth region of the second type and a fifth impurity concentration located laterally within the third region at the surface.

12. The process of claim 11 wherein the steps of providing the fourth and fifth regions, when viewed looking toward the surface, comprise providing the first part of the fourth region having U shaped arms and providing the fifth region at least partly between the U shaped arms.

13. The process of claim 11 wherein the steps of providing the fourth and fifth regions and the Schottky contact comprise providing the fifth region having an annular shape in the plane of the surface surrounding the first portion of the surface and providing the fourth region having U shaped arms overlapping the fifth region.

14. The process of claim 11 wherein the step of forming the Schottky contact comprises, exposing a second portion of the surface on the fifth region and the first portion of the surface on the third region adjacent the fifth region and thereafter simultaneously making a Schottky contact to the first portion of the surface and an ohmic contact to the second portion of the surface.

15. The process of claim 11 further comprising, providing in either order (i) a sixth region of the second type and a sixth impurity concentration at least partly in the second region at the surface and (ii) a seventh region of the first type and a seventh impurity concentration located at least partly in the third region at the surface, wherein the sixth and seventh regions are spaced apart.

16. The process of claim 9 where the step of providing a substrate with a first region comprises implanting a first dopant of the second type to a first depth and first dose and then implanting a second dopant of the second type to a second depth and second dose wherein the second depth is less than the first depth and the second dose is greater than the first dose.

* * * * *